United States Patent
Baselmans et al.

(10) Patent No.: US 8,681,309 B2
(45) Date of Patent: Mar. 25, 2014

(54) LITHOGRAPHIC APPARATUS AND DEVICE MANUFACTURING METHOD

(75) Inventors: Johannes Jacobus Matheus Baselmans, Oirschot (NL); Johannes Christiaan Maria Jasper, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 672 days.

(21) Appl. No.: 12/639,321

(22) Filed: Dec. 16, 2009

(65) Prior Publication Data
US 2010/0171939 A1 Jul. 8, 2010

Related U.S. Application Data

(60) Provisional application No. 61/193,720, filed on Dec. 18, 2008.

(51) Int. Cl.
 *G03B 27/52* (2006.01)
 *G03B 27/58* (2006.01)
 *G03F 7/20* (2006.01)

(52) U.S. Cl.
 CPC .............. *G03F 7/705* (2013.01); *G03F 7/706* (2013.01); *G03F 7/70591* (2013.01); *G03F 7/70891* (2013.01)
 USPC ................... 355/30; 355/55; 355/77

(58) Field of Classification Search
 CPC . G03F 7/70258; G03F 7/705; G03F 7/70516; G03F 7/70591; G03F 7/706; G03F 7/70891; G03F 7/70533
 USPC ..................... 355/30, 53, 55, 67, 77
 See application file for complete search history.

(56) References Cited

U.S. PATENT DOCUMENTS

| | | | | |
|---|---|---|---|---|
| 4,666,273 A | * | 5/1987 | Shimizu et al. | 353/101 |
| 4,701,606 A | * | 10/1987 | Tanimoto et al. | 250/201.4 |
| 4,920,505 A | * | 4/1990 | Suzuki | 399/51 |
| 5,184,176 A | * | 2/1993 | Unno et al. | 355/52 |
| 5,337,097 A | * | 8/1994 | Suzuki et al. | 353/101 |
| 5,721,608 A | * | 2/1998 | Taniguchi | 355/53 |
| 5,805,273 A | * | 9/1998 | Unno | 355/30 |
| 5,864,433 A | * | 1/1999 | Takahashi et al. | 359/637 |
| 5,883,704 A | * | 3/1999 | Nishi et al. | 355/67 |

(Continued)

FOREIGN PATENT DOCUMENTS

| | | |
|---|---|---|
| JP | 62-136821 | 6/1987 |
| JP | 10-041226 | 2/1998 |

(Continued)

OTHER PUBLICATIONS

Japanese Office Action dated Jan. 20, 2012 in corresponding Japanese Patent Application No. 2009-281086.

*Primary Examiner* — Steven H Whitesell Gordon
(74) *Attorney, Agent, or Firm* — Pillsbury Winthrop Shaw Pittman LLP (57) ABSTRACT

In a lithographic method, a characteristic of a projection system is measured before and after periods of heating (exposures) and cooling to provide data to calibrate a model of lens heating. The model has a part modeling the effect of cooling and a part modeling the effect of heating on the characteristic.

20 Claims, 4 Drawing Sheets

(56) References Cited

U.S. PATENT DOCUMENTS

| | | | | |
|---|---|---|---|---|
| 6,088,082 A | * | 7/2000 | Yonekawa | 355/53 |
| 6,563,564 B2 | | 5/2003 | De Mol et al. | |
| 7,084,952 B2 | * | 8/2006 | Jeunink et al. | 355/30 |
| 7,221,430 B2 | * | 5/2007 | Van Dijck et al. | 355/30 |
| 2003/0095243 A1 | * | 5/2003 | Yu et al. | 355/55 |
| 2006/0008716 A1 | * | 1/2006 | Jeunink et al. | 430/30 |
| 2008/0062391 A1 | * | 3/2008 | Uchida et al. | 355/52 |
| 2009/0028421 A1 | * | 1/2009 | Sukegawa | 382/144 |

FOREIGN PATENT DOCUMENTS

| | | |
|---|---|---|
| JP | 10-289864 | 10/1998 |
| JP | 10-294269 | 11/1998 |
| JP | 2001-230193 | 8/2001 |
| JP | 2002-015997 | 1/2002 |
| JP | 2002-134405 | 5/2002 |
| JP | 2009-032875 | 2/2009 |
| WO | WO 2008023071 A1 * | 2/2008 |

* cited by examiner

LITHOGRAPHIC APPARATUS AND DEVICE MANUFACTURING METHOD

This application claims priority and benefit under 35 U.S.C. §119(e) to U.S. Provisional Patent Application No. 61/193,720, entitled "Lithographic Apparatus and Device Manufacturing Method", filed on Dec. 18, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In an optical lithography apparatus, the patterned beam of radiation is usually of high intensity so as to reduce exposure times and increase throughput. Since the elements of the projection system unavoidably absorb a small percentage of the energy of the beam, these elements will heat up and may thereby distort. Such distortion introduces aberrations into the projection system, distorting the projected image. This problem is known generically as lens heating, although it also affects reflective elements such as mirrors. A variety of methods to correct for lens heating effects are known. These include models to predict lens heating effects and adjustable elements to introduce correcting aberrations into the projection system.

SUMMARY

Lens heating effects are most pronounced when the beam is concentrated into a small region of an optical element, e.g. because of the illumination mode or the pattern being projected. In such cases it has been proposed to heat those parts of an element where the beam is concentrated that are not irradiated by the beam so that the element is uniformly heated and distorts less.

Lens heating effects are in general dependent on the pattern being projected and the illumination mode used as these factors determine how concentrated or dispersed the beam is in the projection system. Available models of lens heating generally require calibration data that can be obtained from test exposures of the specific pattern using the intended illumination mode. However, the generation of such test exposures generally takes a significant period of time, reducing the time available for the apparatus to perform useful work.

It is desirable, for example, to provide an improved method of calibrating lens heating effects in a lithographic apparatus, and in particular a calibration method that takes less time.

According to an aspect of the invention, there is provided a method of calibrating a model of the effect on a characteristic of a projection system of a lithographic system of performing exposures according to a recipe, the method comprising:

first measuring the characteristic of the projection system to generate a first measurement result;

exposing a substrate according to the recipe;

second measuring the characteristic of the projection system to generate a second measurement result;

allowing the projection system to cool for a period of time;

third measuring the characteristic of the projection system to generate a third measurement result;

wherein the model has a first part modeling the effect of heating on the characteristic and a second part modeling the effect of cooling on the characteristic, the first, second and third measurement results being used to calibrate the first part and the second part.

According to an aspect of the invention, there is provided a device manufacturing method comprising:

calibrating a model of the effect on a characteristic of a projection system of a lithographic system of performing exposures according to a recipe, the calibrating comprising in order:

first measuring the characteristic of the projection system to generate a first measurement result;

exposing a substrate according to the recipe;

second measuring the characteristic of the projection system to generate a second measurement result;

allowing the projection system to cool for a period of time;

third measuring the characteristic of the projection system to generate a third measurement result;

wherein the model has a first part modeling the effect of heating on the characteristic and a second part modeling the effect of cooling on the characteristic, the first, second and third measurement results being used to calibrate the first part and the second part;

calculating a corrective action to compensate for or ameliorate lens heating effects in the exposure of a second substrate;

exposing the second substrate according to the recipe and performing the corrective action.

According to an aspect of the invention, there is provided a lithographic projection apparatus arranged to project a pattern from a patterning device onto a substrate using a projection system, the apparatus further comprising:

a sensor arranged to measure a characteristic of the projection system;

a controller to control the sensor to generate a first measurement result before exposure of a substrate according to a recipe, a second measurement result after the exposure and a third measurement result after allowing the projection system to cool for a period of time; and a storage device storing a model of the effect of performing exposures according to the recipe on a characteristic of the projection system, the model having a first part modeling the effect of heating on the characteristic and a second part modeling the effect of cooling on the characteristic, the first, second and third measurement results being used to calibrate the first part and the second part.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
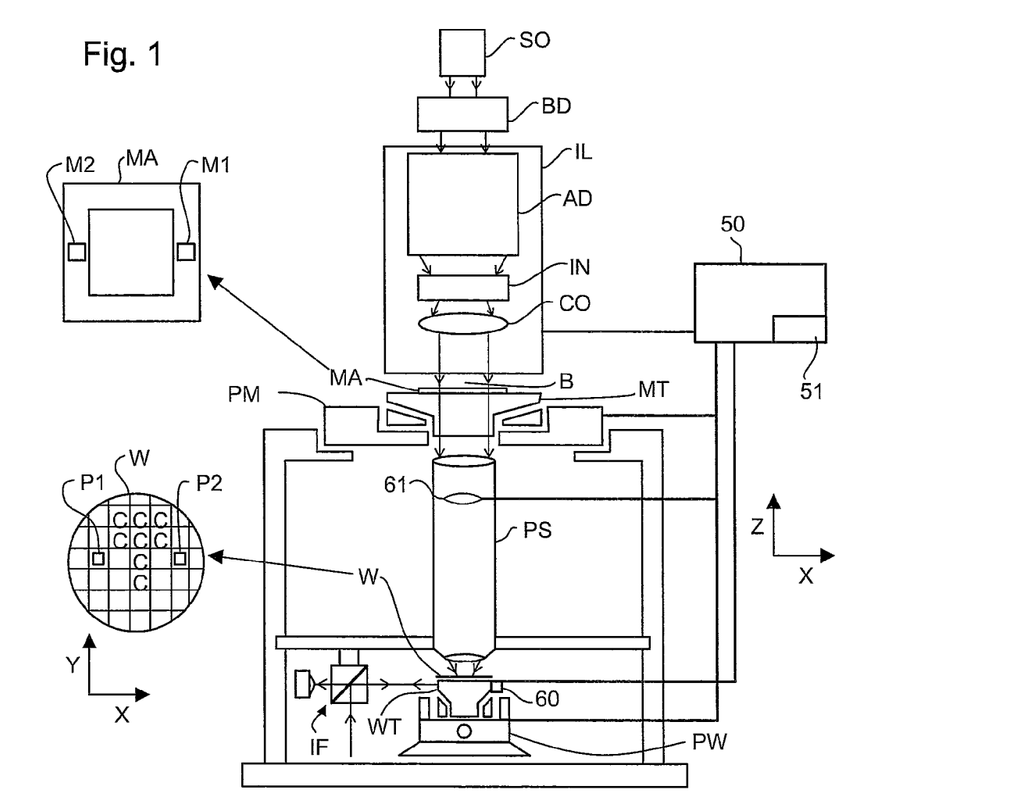
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror mays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks) Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to masldess lithography that utilizes programmable patterning device, such as a programmable mirror array of a type as referred to above.

Combinations and/or variations on the above described modes of use or entirely different modes of use may also be employed.

In a typical lithographic apparatus, the projection system, as a whole or one or more particular elements within it, is not perfectly transmissive (or reflective). This means that when the lithographic apparatus is operated to expose a substrate, an element of the projection system absorb energy from the beam. If the element of the projection system absorbs energy from the beam, it will heat up. Such heating, particularly if strongly non-uniform, frequently introduces or alters aberrations of the projection system. This may occur through a change in the shape of the element and/or in the refractive index of a refractive element. Various measures to combat this phenomenon, which is generally referred to as lens heating even when occurring in reflective or catadioptric projection systems, are known. In particular, the projection system of a lithographic apparatus may include a temperature control system that aims to maintain an affected element of the projection system at a substantially constant temperature, to a high degree of accuracy. Other measures include one or more adjustable elements 61 within the projection system that can be controlled in real time to compensate for the aberrations induced by lens heating (e.g., by introducing further aberrations).

The temperature control system for the projection system typically tries to maintain the temperature of the outside of an element of the projection system (e.g. each lens element) at a substantially fixed value. If the apparatus is not in use for a sufficiently long period, the element will be at this uniform "rest" temperature. This is typically called a "cold lens". In case of (non-uniform) heating, a different thermal equilibrium will be realized after some period of time (often of the order of 90 minutes). In this case there will exist a temperature distribution across the body of the element. This temperature distribution will give rise to an aberration distribution. Since the typical substrate lot (a group of substrates exposed with the same patterning device, illumination and dose) is exposed in about 10 minutes, i.e. a shorter period than the largest time constant involved (which may be about 25 minutes), the system will be in a transition state most of the time, going from one thermal equilibrium to the other.

Lens heating effects are greatest when the beam is highly localized at a particular element. Localization of the beam may occur with exposure of a particular pattern and/or a particular illumination mode. For example, an illumination mode with substantial off-axis components, such as dipole and quadrupole, tends to lead to large lens heating effects. Because lens heating effects are strongly dependent on the pattern being imaged, the illumination mode and/or numerical aperture of the projection system used, a model of lens heating effects that is used to calculate compensatory adjustments of the projection system or other process parameters, is calibrated for each pattern, illumination mode and numerical aperture combination that is to be exposed.

Calibration of a lens heating model involves measurement of relevant imaging characteristics of the projection system after one or more substrates have been exposed. However, before this calibration can begin the projection system must be allowed to cool to a standard temperature. Otherwise it is not possible to distinguish between a change in the measured characteristic of the projection system that is due to the cooling of the projection system from one or more preceding exposures and a change due to heating by a current exposure. This can be seen more clearly from FIGS. 2 and 3.

Figure 2:
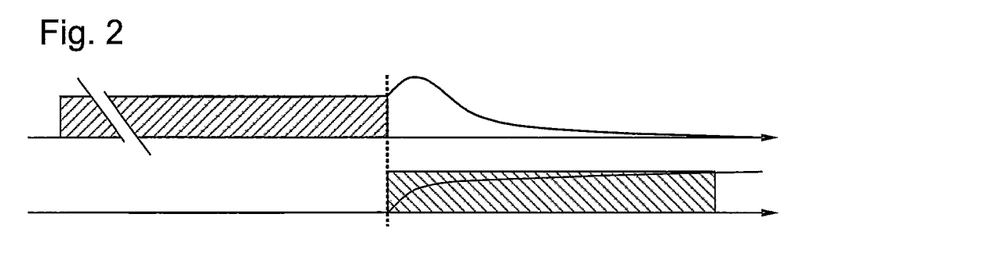
FIGS. 2 and 3 depict typical responses of a characteristic of a projection system to heating and cooling periods.

FIG. 2 illustrates the typical response of a parameter of the projection system, for example astigmatism offset, to the cessation of heating (upper graph) and at the beginning of a period of heating (lower graph). After cessation of heating (one or more exposures) the measured characteristic will continue to deviate from its normal value for a period before declining back to its normal value, at the nominal rest temperature. This behavior is due to the long thermal time constant of the element of the projection system. When heating starts, the relevant characteristic of the projection system will begin to deviate quite quickly from its normal value and then approach asymptotically a maximum deviated value at whatever equilibrium temperature it reaches during exposure.

Figure 3:
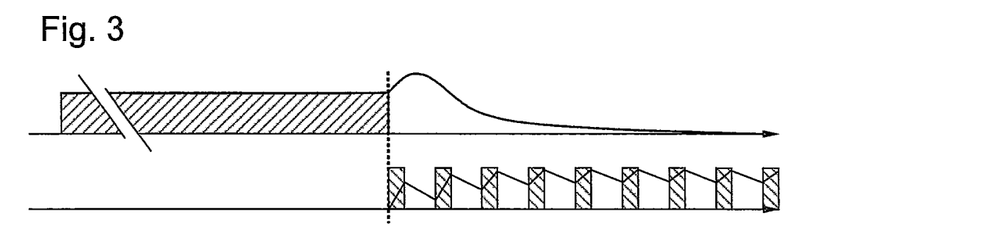

As shown in FIG. 3, (lower graph), in the more realistic case where the heating comprises periods of heating (corresponding to exposure of a single substrate) separated by periods of cooling (corresponding to the time taken to unload an exposed substrate and load a new, unexposed substrate (referred to below as substrate swap)) the resultant behavior of the optical element is quite complex. (It should be noted that even within exposure of a single substrate, heating of the element is intermittent due to the separate exposures of target areas on each substrate and even in some cases the use of a pulsed beam, but the periodicity of such heating is much smaller than a relevant thermal time constant of the element of the projection system so that the exposures of a substrate can be treated as a single uninterrupted period of heating.)

Because of the above-described complex behavior of lens heating effects it has conventionally been necessary to allow the projection system to reach its nominal equilibrium temperature before beginning a series of exposures to calibrate a lens heating model for a specific pattern and illumination mode (recipe). Due to the long time thermal constant of the elements of the projection system, it may take 90 minutes or more for the projection system to return to its nominal equilibrium temperature. During this period, the apparatus is necessarily idle thus substantially reducing its throughput. This means that modeling of and compensation for lens heating effects is uneconomic if the recipe is changed frequently. Thus, lens heating effects are often only modeled and compensated for in very high volume applications, such as the production of memory. It would therefore be desirable to provide an improved method for calibration of lens heating effects that avoids, e.g., unnecessary idle time of the apparatus.

In an embodiment of the invention, to calibrate the effects of lens heating on a particular optical element characteristic, that characteristic is measured before exposure of a substrate, after exposure of a substrate and before exposure of a next substrate. The additional measurements of the characteristic enable the effects of cooling and heating to be separated so that a model of lens heating effects on that characteristic can be calibrated without an initial cooling period. This method is described further below with reference to a particular characteristic, astigmatism offset, but is applicable to other characteristics such as field curvature (axial placement error of the image quadratic in the field), astigmatism curvature (quadratic astigmatism variation over the field), magnification and/or third order distortion (lateral placement error of the image third order in the field). In principle, an embodiment of the invention can be applied to any aberration that can be measured by a sensor 60. An embodiment of the invention is applied to aberrations described by Zernike polynomials.

Figure 4:
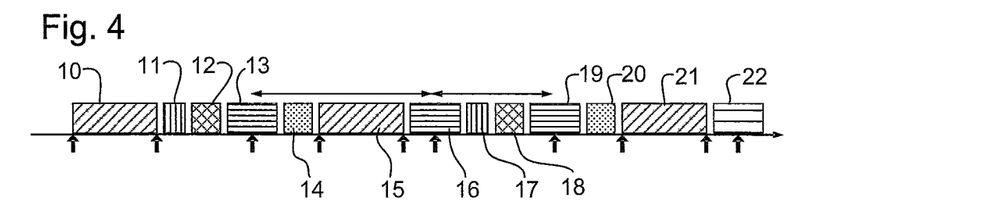
FIG. 4 depicts steps carried out in a series of exposures of multiple substrates.

FIG. 4 shows a series of actions in a method according to an embodiment of the invention for calibrating a model of the effect of lens heating on a characteristic of the projection system. These steps are carried out in this embodiment in a lithographic apparatus having two substrate tables, but the method is equally applicable to lithographic apparatus having only a single substrate table or more than two substrate tables. As can be seen in FIG. 4, after completion of a series of exposures 10 of a substrate (details of which are not relevant except that it leaves one or more optical elements of the projection system PS in a heated state), the exposed substrate is swapped 11 for a new substrate (e.g., by swapping substrate tables) which is to be exposed with the recipe for which the lens heating model is to be calibrated. A first alignment procedure 12 is carried out to align the substrate W to the substrate table WT and then a first measurement 13 of the characteristic of interest is performed. This measurement may be performed with an image sensor (e.g. a transmission image sensor) or an interferometric aberration sensor 60 which may be integrated into the substrate table. A second alignment procedure 14 is then performed to align targets on the patterning device to targets on the substrate table WT and the one or more exposures of the recipe of interest are carried out 15. As soon as possible after the one or more exposures have been completed, a second measurement 16 of the characteristic of interest is performed. After another substrate swap operation 17, the first alignment procedure 18 is performed on the new substrate. Then a third measurement 19 of the characteristic of interest is performed. The second alignment procedure 20 is then performed on the new substrate and this is again exposed 21 using the recipe of interest. After this, a fourth measurement 22 of the characteristic of interest is performed. Details of the alignment procedures are not relevant and they may be omitted or combined if not required and need not be the same each time performed.

The cycle: swap, first alignment, measure, second alignment, expose, measure; is then repeated as often as necessary. In an embodiment these steps are repeated for the exposure of a whole lot of substrates (e.g. 12 or 24 substrates taking about 5 to 10 minutes) allowing a lot feedback correction. Typically, a lot is defined as a group of substrates wherein the substrates are exposed sequentially and at the same numerical aperture setting of the projection system. In an embodiment, these steps are repeated for a period of time longer than all of the time constants to be modeled, for example for about 30 minutes. Once sufficient data points have been gathered to calibrate the lens heating model, the measurements of the characteristic of interest can be omitted, increasing throughput. If lens heating effects on multiple characteristics of the projection system are to be modeled, those characteristics may be measured simultaneously or in separate measurements, depending on the capabilities of the sensor used. Desirably, a sensor is used that is capable of measuring a complete aberration state of the projection system for a plurality of field positions simultaneously. Such a sensor allows a more accurate modeling of lens heating effects on the multiple characteristics of the projection system. The above processes are performed by the apparatus under the control of controller 50, which also includes a storage device 51 to store the calibrated model.

To calibrate the lens heating model, the period between the midpoint of the first characteristic measurement 13 and the second characteristic measurement 16 is considered a period of heating of the projection system and the period between the midpoint of the second characteristic measurement 16 and third characteristic measurement 19 is considered a period of cooling. The midpoints of these measurements are indicated by black arrows. Thus, the first and second measurements of the characteristic of interest, and subsequent measurements just before and just after exposures, can be used to calibrate a model of the effects of heating by performing exposures, while the results of the second and third measurements of the characteristics of interest, and subsequent measurements either side of the substrate swap, can be used to calibrate a model of the effect on the characteristic of interest of cooling.

In a particular example, the characteristic of interest is astigmatism offset, that is the average focus difference between horizontal and vertical lines, and the heating and cooling effects (A) as a function of time can be modeled as follows:

$$A(t) = \sum_k \mu_k \cdot e^{-\frac{t}{\tau_k}} + P \cdot \sum_h \mu_h \cdot e^{-\frac{x}{\tau_h}} \frac{1 - e^{-\frac{t}{\tau_h}}}{1 + e^{-\frac{x}{\tau_h}}} \quad (1)$$

$$A(t) = \sum_k \mu_k \cdot e^{-\frac{t}{\tau_k}} + P \cdot \sum_h \mu_h \cdot \frac{1 - e^{-\frac{t+x}{\tau_h}}}{1 + e^{-\frac{x}{\tau_h}}} \quad (2)$$

where:

t is the time with respect to the start of the first exposure, $\mu_k$, $\mu_h$ are scaling factors, the indices k and h indicating that the total response of previous and current exposures are described by multiple time constants and scaling factors, $\tau_h$, $\tau_k$, are the time constants from the cooling and heating, P is the power passing the element (within one expose time: x) (i.e. the product of dose, field size, patterning device (e.g. mask) transmission and number of exposures), and x is the time between exposures and the exposure time.

The measurements taken in an embodiment of the invention can be used to determine the various time constants.

These equations can be derived as illustrated below for the simplified case of a single time constant each for heating and cooling. This can be extended for multiple time constants by adding additional terms as required.

For k=0; start of the new lot (measurement 13):

$$A_1(t) + A_2(t) = \mu_1 \quad (3)$$

for k=1; t=x, just a uniform exposure (measurement 16):

$$A_1(t) + A_2(t) = \mu_1 \cdot e^{-\frac{x}{\tau_1}} + P \cdot \mu_2 \cdot \left(1 - e^{-\frac{x}{\tau_2}}\right) \quad (4)$$

for k=2; t=2x, cool both processes (measurement 19):

$$A_1(t) + A_2(t) = \mu_1 \cdot e^{-\frac{2x}{\tau_1}} + P \cdot \mu_2 \cdot \left(e^{-\frac{x}{\tau_2}} - e^{-\frac{2x}{\tau_2}}\right) \quad (5)$$

for $k = 3; t = 3x$ $$A_1(t) + A_2(t) = \mu_1 \cdot e^{-\frac{3x}{\tau_1}} + P \cdot \mu_2 \cdot \left(1 - e^{-\frac{x}{\tau_2}} + e^{-\frac{2x}{\tau_2}} - e^{-\frac{3x}{\tau_2}}\right) \quad (6)$$

for $k = 4; t = 4x$ $$A_1(t) + A_2(t) = \mu_1 \cdot e^{-\frac{4x}{\tau_1}} + P \cdot \mu_2 \cdot \left(e^{-\frac{x}{\tau_2}} - e^{-\frac{2x}{\tau_2}} + e^{-\frac{3x}{\tau_2}} - e^{-\frac{4x}{\tau_2}}\right) \quad (7)$$

Now use a geometric series:

$$\sum_{m=0}^{\infty} \alpha^m = \frac{1}{1 - \alpha} \quad (8)$$

And use two geometric series for a finite series:

$$\sum_{m=0}^{k} \alpha^m = \sum_{m=0}^{\infty} \alpha^m - \alpha^{k+1} \sum_{m=0}^{\infty} \alpha^m = \frac{1 - \alpha^{k+1}}{1 - \alpha} \quad (9)$$

to write the equations above in a more closed form.

Use $\alpha = -e^{-\frac{x}{\tau_2}}$ (10)

$A(0) = \mu_1$ $$A(x) = \mu_1 \cdot e^{-\frac{x}{\tau_1}} + P \cdot \mu_2 \cdot \frac{1 - e^{-\frac{2x}{\tau_2}}}{1 + e^{-\frac{x}{\tau_2}}}$$

$$A(2 \cdot x) = \mu_1 \cdot e^{-\frac{2x}{\tau_1}} + P \cdot \mu_2 \cdot e^{-\frac{x}{\tau_2}} \cdot \frac{1 - e^{-\frac{2x}{\tau_2}}}{1 + e^{-\frac{x}{\tau_2}}}$$

$$A(3 \cdot x) = \mu_1 \cdot e^{-\frac{3x}{\tau_1}} + P \cdot \mu_2 \cdot \frac{1 - e^{-\frac{4x}{\tau_2}}}{1 + e^{-\frac{x}{\tau_2}}}$$

$$A(4 \cdot x) = \mu_1 \cdot e^{-\frac{4x}{\tau_1}} + P \cdot \mu_2 \cdot e^{-\frac{x}{\tau_2}} \cdot \frac{1 - e^{-\frac{4x}{\tau_2}}}{1 + e^{-\frac{x}{\tau_2}}}$$

Split this up into pre (even x) and post (odd x) exposure measurements:

Pre-expose/post cool:

$$A(t) = \mu_1 \cdot e^{-\frac{t}{\tau_1}} + P \cdot \mu_2 \cdot e^{-\frac{x}{\tau_2}} \frac{1 - e^{-\frac{t}{\tau_2}}}{1 + e^{-\frac{x}{\tau_2}}} \quad (11)$$

Post-expose/pre cool:

$$A(t) = \mu_1 \cdot e^{-\frac{t}{\tau_1}} + P \cdot \mu_2 \cdot \frac{1 - e^{-\frac{t+x}{\tau_2}}}{1 + e^{-\frac{x}{\tau_2}}} \quad (12)$$

As can be seen, equations (11) and (12) correspond to the equations (1) and (2).

Figure 5:
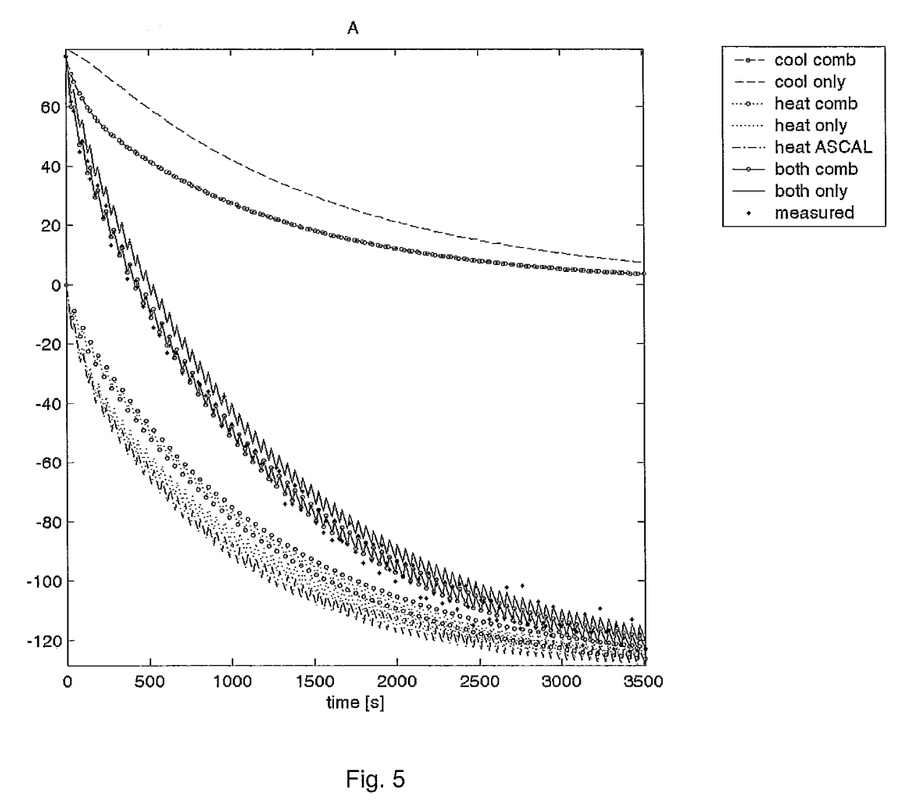
FIG. 5 is a graph showing separation of heating and cooling effects according to an embodiment of a method of the invention.

The results of some tests are shown in FIG. 5. In this Figure, time is plotted on the X axis and astigmatism offset in arbitrary units on the Y axis. Black dots are data points and the associated short-dashed line is a fit to these data points. Using the above models, the effect of cooling and heating can be separated. The double chain line shows the predicted cooling curve and the long-dashed line the cooling effects from the measured data. At the lower part of the graph a solid line shows the predicted effect of heating and the line with circles shows the heating effect from the measured data. This data was obtained from a dual-stage lithographic apparatus and the zigzag in the heating data derives from the cooling effect of chuck swaps.

Figure 6:
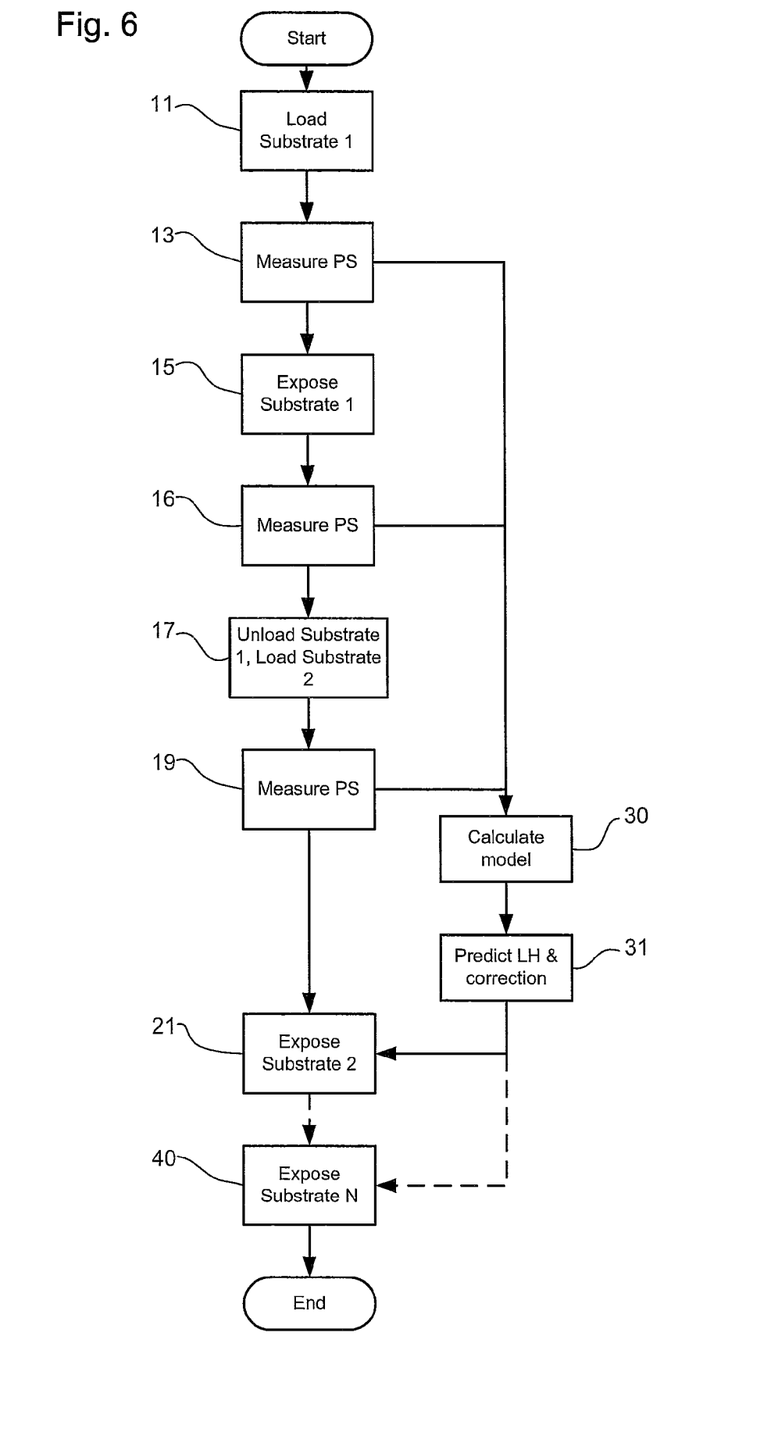
FIG. 6 is a flow diagram of a device manufacturing method according to an embodiment of the invention.

A device manufacturing method according to an embodiment is shown in FIG. 6. In this method, a plurality of substrates are exposed with the same recipe. The first substrate to be exposed, substrate 1, is used to provide data for calibration of a lens heating model. Thus steps of: unloading a preceding substrate and loading substrate 1, step 11; measuring the projection system, step 13; exposing substrate 1, step 15; measuring the projection system, step 16; unloading substrate 1 and loading substrate 2, step 17; and measuring the projection system, step 19, are performed as described above with reference to FIG. 4. Alignment steps may also be performed as described above but are omitted from this Figure for clarity. The data from the three measurements of the projection system are used, in step 30, to calibrate a model of the lens heating effect of this recipe. This model is then used, in step 31, to predict the lens heating effect to be expected when, in step 21, exposing substrate 2 and to calculate any compensatory or ameliorating adjustments to the exposure process, or a subsequent process on the substrate. The model can similarly be used when exposing any subsequent substrates in step 40, e.g. substrate N, using the same recipe even if other recipes are used in the meantime.

In an embodiment of the invention, alternative or additional measurements of the characteristic of interest are performed in between a first and second lot. If the second lot of substrates is exposed at a different numerical aperture of the projection system as compared to the first lot, different lens heating effects likely occur during exposure of the second lot as compared to a situation where the two lots are exposed at the same numerical aperture. To take into account these different lens heating effects, the second measurement, being the measurement of the characteristic of interest after exposure of the last substrate of the first lot, is performed at the numerical aperture of the second lot. The third measurement, being the measurement before exposure of the first substrate of the second lot, is also performed at the numerical aperture of the projection system of the second lot. A linear interpolation of the second and third measurements can be used to calibrate a model of the effect of cooling on the characteristic of interest. By adding this modeled cooling to the expected effect of heating on the characteristic of interest, a prediction of the total effect on the characteristic of interest may be determined for the first substrate of the second lot. These measurements at a different numerical aperture of the projection system may be performed instead of or additionally to the second and third measurement as described above, for example, in paragraph [0042]. The expected effect of heating on the characteristic of interest may be calibrated by measuring the characteristic of interest before and after a test exposure of a substrate at the exposure conditions of the second lot.

An embodiment of the invention can be used to derive a library of calibrated lens heating models, stored in a storage device, for a plurality of recipes. The appropriate lens heating model can be selected and used to predict lens heating effects and calculate compensatory measures for any recipe that has been previously calibrated. Thus different recipes may be used in any order without needing to recalibrate the lens heating model every time a different recipe is used.

In an embodiment of the invention, additional measurements of the characteristic of interest are performed in order to reduce the effect of measurement noise on the calibration of the lens heating model. The additional measurements may be performed sequentially after at least one of the first, second, third or fourth measurement or alternatively or additionally in between the first, second, third and fourth measurements.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of calibrating a model of the effect on an optical characteristic of a projection system of a lithographic system of performing exposures according to a recipe, the method comprising in order:

first measuring the optical characteristic of the projection system to generate a first measurement result;

exposing a substrate according to the recipe;

second measuring the optical characteristic of the projection system to generate a second measurement result;

allowing the projection system to cool for a period of time;

third measuring the optical characteristic of the projection system to generate a third measurement result;

second exposing according to the recipe; and fourth measuring the optical characteristic of the projection system to generate a fourth measurement result, wherein the model has a first part modeling the effect of heating on the optical characteristic and a second part modeling the effect of cooling on the optical characteristic, the first, second, third and fourth measurement results being used to calibrate the first part and the second part, the calibrated first and second parts used for subsequent calculation of a compensatory adjustment of the projection system or other exposure process parameter.

2. The method of claim 1, wherein the second exposing comprises exposing a second substrate according to the recipe and further comprising in order after the fourth measuring:

allowing the projection system to cool for a period of time;

fifth measuring the optical characteristic of the projection system to generate a fifth measurement result;

wherein the third and fourth measurement results are used to calibrate the first part and the fourth and fifth measurements are used to calibrate the second part.

3. The method of claim 1, wherein the optical characteristic is at least one optical characteristic selected from the group consisting of astigmatism offset, field curvature, astigmatism curvature, magnification, third order distortion, or an aberration described by Zernike polynomials and sums of Zernike polynomials.

4. The method of claim 1, wherein the measurements are used to determine time constants of heating and cooling curves.

5. The method of claim 1, wherein the first part comprises a curve of the form:

$$A(t) = \sum_k \mu_k \cdot e^{-\frac{t}{\tau_k}} + P \cdot \sum_h \mu_h \cdot e^{-\frac{x}{\tau_h}} \frac{1 - e^{-\frac{t}{\tau_h}}}{1 + e^{-\frac{x}{\tau_h}}}$$

and the second part comprises a curve of the form:

$$A(t) = \sum_k \mu_k \cdot e^{-\frac{t}{\tau_k}} + P \cdot \sum_h \mu_h \cdot \frac{1 - e^{-\frac{t+x}{\tau_h}}}{1 + e^{-\frac{x}{\tau_h}}}.$$

6. The method of claim 1, wherein the substrate is removed from a table on which it was exposed and a second substrate loaded onto the table while the projection system is allowed to cool.

7. The method of claim 1, wherein the second and third measuring of the optical characteristic of the projection system are performed at respectively a first and second numerical aperture of the projection system.

8. A device manufacturing method comprising:

calibrating a model of the effect on an optical characteristic of a projection system of a lithographic system of performing exposures according to a recipe, the calibrating comprising in order:

first measuring the optical characteristic of the projection system to generate a first measurement result;

exposing a substrate according to the recipe;

second measuring the optical characteristic of the projection system to generate a second measurement result;

allowing the projection system to cool for a period of time;

third measuring the optical characteristic of the projection system to generate a third measurement result;

second exposing according to the recipe; and fourth measuring the optical characteristic of the projection system to generate a fourth measurement result, wherein the model has a first part modeling the effect of heating on the optical characteristic and a second part modeling the effect of cooling on the optical characteristic, the first, second, third and fourth measurement results being used to calibrate the first part and the second part, the calibrated first and second parts used for subsequent calculation of a compensatory adjustment of the projection system or other exposure process parameter;

calculating a corrective action to compensate for or ameliorate lens heating effects in the exposure of a second substrate;

exposing the second substrate according to the recipe and performing the corrective action.

9. The method of claim 8, wherein the exposing the second substrate is performed after exposure of a substrate according to at least one other recipe.

10. The method of claim 8, wherein the second exposing comprises exposing a second substrate according to the recipe and further comprising in order after the fourth measuring:

allowing the projection system to cool for a period of time;

fifth measuring the optical characteristic of the projection system to generate a fifth measurement result;

wherein the third and fourth measurement results are used to calibrate the first part and the fourth and fifth measurements are used to calibrate the second part.

11. The method of claim 8, wherein the measurements are used to determine time constants of heating and cooling curves.

12. The method of claim 8, wherein the first part comprises a curve of the form:

$$A(t) = \sum_k \mu_k \cdot e^{-\frac{t}{\tau_k}} + P \cdot \sum_h \mu_h \cdot e^{-\frac{x}{\tau_h}} \frac{1 - e^{-\frac{t}{\tau_h}}}{1 + e^{-\frac{x}{\tau_h}}}$$

and the second part comprises a curve of the form:

$$A(t) = \sum_k \mu_k \cdot e^{-\frac{t}{\tau_k}} + P \cdot \sum_h \mu_h \cdot \frac{1 - e^{-\frac{t+x}{\tau_h}}}{1 + e^{-\frac{x}{\tau_h}}}.$$

13. The method of claim 8, wherein the substrate is removed from a table on which it was exposed and the second substrate loaded onto the table while the projection system is allowed to cool.

14. The method of claim 8, wherein the second and third measuring of the optical characteristic of the projection system are performed at respectively a first and second numerical aperture of the projection system.

15. A lithographic projection apparatus arranged to project a pattern from a patterning device onto a substrate using a projection system, the apparatus further comprising:

a sensor arranged to measure an optical characteristic of the projection system;

a controller to control the sensor to generate a first measurement result before exposure of a substrate according to a recipe, a second measurement result after the exposure, a third measurement result after allowing the projection system to cool for a period of time, and a fourth measurement after the cooling and after a further exposure according to the recipe; and a storage device storing a model of the effect of performing exposures according to the recipe on an optical characteristic of the projection system, the model having a first part modeling the effect of heating on the optical characteristic and a second part modeling the effect of cooling on the optical characteristic, the first, second, third and fourth measurement results being used to calibrate the first part and the second part, the calibrated first and second parts used for subsequent calculation of a compensatory adjustment of the projection system or other exposure process parameter.

16. The lithographic apparatus of claim 15, wherein the storage device stores a plurality of models of the effects on an optical characteristic of the projection system of performing exposures according to a plurality of recipes.

17. The lithographic apparatus of claim 15, wherein the further exposure comprises exposure of a second substrate according to the recipe and the controller is further configured to generate a fifth measurement result after allowing the projection system to cool for a period of time, wherein the third and fourth measurement results are used to calibrate the first part and the fourth and fifth measurements are used to calibrate the second part.

18. The lithographic apparatus of claim 15, wherein the measurements are used to determine time constants of heating and cooling curves.

19. The lithographic apparatus of claim 15, wherein the first part comprises a curve of the form:

$$A(t) = \sum_k \mu_k \cdot e^{-\frac{t}{\tau_k}} + P \cdot \sum_h \mu_h \cdot e^{-\frac{x}{\tau_h}} \frac{1 - e^{-\frac{t}{\tau_h}}}{1 + e^{-\frac{x}{\tau_h}}}$$

and the second part comprises a curve of the form:

$$A(t) = \sum_k \mu_k \cdot e^{-\frac{t}{\tau_k}} + P \cdot \sum_h \mu_h \cdot \frac{1 - e^{-\frac{t+x}{\tau_h}}}{1 + e^{-\frac{x}{\tau_h}}}.$$

20. The lithographic apparatus of claim 15, wherein the second and third measurements are performed at respectively a first and second numerical aperture of the projection system.

* * * * *